United States Patent
Tomikawa et al.

(10) Patent No.: US 10,026,637 B2
(45) Date of Patent: Jul. 17, 2018

(54) POLYIMIDE RESIN, RESIN COMPOSITION USING SAME, AND LAMINATED FILM

(71) Applicant: Toray Industries, Inc., Tokyo (JP)

(72) Inventors: Masao Tomikawa, Otsu (JP); Takuo Watanabe, Otsu (JP); Chungseo Lee, Gumi-si (KR)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 15/121,446

(22) PCT Filed: Feb. 24, 2015

(86) PCT No.: PCT/JP2015/055222
§ 371 (c)(1),
(2) Date: Aug. 25, 2016

(87) PCT Pub. No.: WO2015/129682
PCT Pub. Date: Sep. 3, 2015

(65) Prior Publication Data
US 2016/0372357 A1    Dec. 22, 2016

(30) Foreign Application Priority Data

Feb. 26, 2014 (JP) ................. 2014-034900

(51) Int. Cl.
| | |
|---|---|
| C08G 77/455 | (2006.01) |
| H01L 21/683 | (2006.01) |
| C09J 179/08 | (2006.01) |
| H01L 23/29 | (2006.01) |
| B32B 7/12 | (2006.01) |
| B32B 27/28 | (2006.01) |
| C08G 73/10 | (2006.01) |
| H01L 21/304 | (2006.01) |
| C09J 7/28 | (2018.01) |
| C09J 7/29 | (2018.01) |
| C08L 61/28 | (2006.01) |

(52) U.S. Cl.
CPC ............ *H01L 21/6836* (2013.01); *B32B 7/12* (2013.01); *B32B 27/281* (2013.01); *C08G 73/106* (2013.01); *C08G 73/1039* (2013.01); *C08G 73/1046* (2013.01); *C08G 73/1082* (2013.01); *C08G 77/455* (2013.01); *C08L 61/28* (2013.01); *C09J 7/28* (2018.01); *C09J 7/29* (2018.01); *C09J 179/08* (2013.01); *H01L 21/304* (2013.01); *H01L 23/293* (2013.01); *B32B 2307/304* (2013.01); *B32B 2307/306* (2013.01); *B32B 2457/00* (2013.01); *B32B 2457/14* (2013.01); *C08G 2170/00* (2013.01); *C09J 2203/326* (2013.01); *H01L 2924/0002* (2013.01)

(58) Field of Classification Search
CPC .................................................. C08G 77/455
See application file for complete search history.

(56) References Cited

U.S. PATENT DOCUMENTS

| | | | | |
|---|---|---|---|---|
| 3,325,450 | A | * | 6/1967 | Holub .................... C08G 77/00 524/588 |
| 6,096,850 | A | | 8/2000 | Chiang et al. |
| 2003/0012882 | A1 | | 1/2003 | Tokuhisa et al. |
| 2003/0026998 | A1 | * | 2/2003 | Yamaguchi ........ C08G 73/1064 428/425.5 |
| 2015/0017370 | A1 | | 1/2015 | Watanabe et al. |

FOREIGN PATENT DOCUMENTS

| | | |
|---|---|---|
| CN | 1406262 A | 3/2003 |
| JP | 63-035626 A | 2/1988 |
| JP | 03-195730 A | 8/1991 |
| JP | 05-200946 A | 8/1993 |
| JP | 09-183850 A | 7/1997 |
| JP | 11-126855 A | 5/1999 |
| JP | 2004-277619 A | 10/2004 |
| JP | 2007-063331 A | 3/2007 |

(Continued)

OTHER PUBLICATIONS

Written Opinion and Revised International Search Report dated May 12, 2015.
The First Office Action dated Jun. 30, 2017, of corresponding Chinese Application No. 201580010593.2, along with an English translation.
Office Action dated Aug. 15, 2017, of corresponding Singapore Application No. 11201606994X.

*Primary Examiner* — Kuo Liang Peng
(74) *Attorney, Agent, or Firm* — DLA Piper LLP (US)

(57) ABSTRACT

A polyimide resin includes an acid anhydride residue; and a diamine residue, the polyimide resin including a residue of a polysiloxane diamine represented by Formula (1) in an amount of not less than 60% by mole in the total amount of the diamine residue:

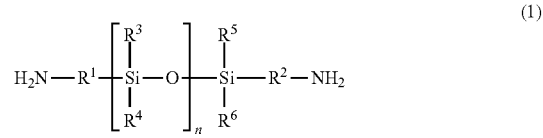

(1)

wherein, n is a natural number and an average value thereof calculated from the average molecular weight of the polysiloxane diamine is 45 to 200; $R^1$ and $R^2$, the same or different, each represent an alkylene group having 1 to 30 carbon atoms or a phenylene group; and $R^3$ to $R^6$, the same of different, each represent an alkyl group having 1 to 30 carbon atoms, a phenyl group or a phenoxy group.

15 Claims, No Drawings

(56) References Cited

FOREIGN PATENT DOCUMENTS

| | | |
|---|---|---|
| JP | 2007-211204 A | 8/2007 |
| JP | 2007-314647 A | 12/2007 |
| JP | 2009-292979 A | 12/2009 |
| JP | 10-265571 A | 11/2010 |
| JP | 2012-019079 A | 1/2012 |
| JP | 2014-118532 A | 6/2014 |
| KR | 1020110040302 | 4/2011 |
| TW | 201317276 A | 5/2013 |
| WO | 2013/039029 A1 | 3/2013 |
| WO | 2013/047451 A1 | 4/2013 |
| WO | 2014/050878 A1 | 4/2014 |

\* cited by examiner

POLYIMIDE RESIN, RESIN COMPOSITION USING SAME, AND LAMINATED FILM

TECHNICAL FIELD

This disclosure relates to a heat-resistant adhesive, more particularly, to a heat-resistant adhesive that generates no volatile component due to its decomposition and the like even under a high-temperature environment, has excellent adhesiveness and can be used as, for example, a material for the production processes of electronic devices.

BACKGROUND

Conventionally, a variety of rubber-based adhesives such as natural rubber and styrene-butadiene rubber, have been commonly used as adhesives, and acrylic resins and silicone resins have been used as materials for the production processes of electronic devices where high heat resistance is required.

Acrylic resins also have high transparency and are thus often used as optical materials for flat displays such as liquid crystal displays. However, since acrylic resins themselves are decomposed and generate volatile components when left to stand for a long time at a temperature of 200° C. or higher, especially 250° C. or higher, acrylic resins are insufficient in terms of heat resistance. Silicone resins have a wide service temperature range extending from low temperatures to high temperatures and exhibit superior heat resistance than acrylic resins. However, silicone resins also generate volatile components due to decomposition and the like when left to stand for a long time at a temperature of 250° C. or higher, especially 300° C. or higher. In addition, silicone-based adhesives have a problem in that they contain a low-molecular-weight silicone component that adversely affects electronic parts.

Examples of resins having a heat resistance of 250° C. or higher include polyimide resins. Although polyimide resins have a problem in that the handling thereof is difficult due to their high processing temperatures, it has been proposed to use a polyimide resin in the form of a siloxane-based polyimide resin copolymerized with siloxane diamine for the application as a bonding agent or an adhesive (see, for example, Japanese Patent Application Laid-Open Publication (JP-A) No. H5-200946 and JP-A No. 2004-277619). However, since the copolymerized siloxane diamine has a low molecular weight or is contained in a small amount, although these siloxane-based polyimide resins can be used as bonding agents, they are insufficient for the use as an adhesive required to have a press-bonding property at room temperature. Accordingly, polysiloxane-based polyimide resins in which a relatively high-molecular-weight polysiloxane diamine is copolymerized in a large amount have been proposed (see, for example, WO 2013/039029 and JP-A No. H9-183850).

However, even these polysiloxane-based polyimide resins are still insufficient in terms of adhesive strength and have a problem in performing uniform adhesion over a large area. It could therefore be helpful to provide a polyimide resin that generates no volatile component due to decomposition or the like even at a high temperature of 250° C. or higher and exhibits sufficiently high adhesive strength in a uniform manner over a large area when used for adhesion at room temperature; a resin composition comprising the polyimide resin; and a laminated film.

SUMMARY

We thus provide a polyimide resin comprising at least an acid anhydride residue and a diamine residue, the polyimide resin being characterized by comprising a residue of a polysiloxane diamine represented by Formula (1) in an amount of not less than 60% by mole in the total amount of the diamine residue:

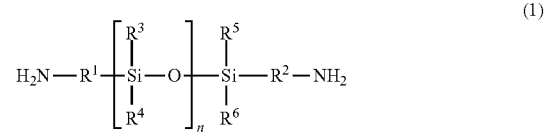

wherein, n is a natural number and an average value thereof calculated from the average molecular weight of the polysiloxane diamine is 45 to 200; $R^1$ and $R^2$, the same or different, each represent an alkylene group having 1 to 30 carbon atoms or a phenylene group; and $R^3$ to $R^6$, the same or different, each represent an alkyl group having 1 to 30 carbon atoms, a phenyl group or a phenoxy group.

The term "residue" means a chemical structure that exists in a chemical substance such as a polymer and is originated from a raw material, and each residue is indicated with the name or abbreviation of the raw material.

Adhesion can be performed uniformly over a large area even at room temperature with expression of good adhesiveness. Further, a polyimide resin having excellent heat resistance that generates no volatile component due to decomposition or the like even at a high temperature of 250° C. or higher; a resin composition comprising the polyimide resin; and a laminated film can be provided.

DETAILED DESCRIPTION

The polyimide resin can be laminated on a heat-resistant insulation film, a glass substrate, a silicon wafer or the like to be used as an adhesive layer-laminated film or adhesive layer-laminated substrate.

The polyimide resin comprises at least an acid dianhydride residue and a diamine residue, and the diamine residue contains a residue of a polysiloxane diamine represented by Formula (1):

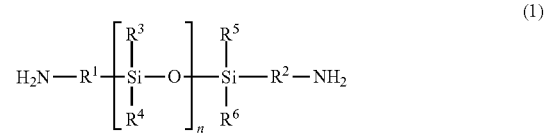

The n is a natural number and the average value thereof calculated from the average molecular weight of the polysiloxane diamine is 45 to 200. The $R^1$ and $R^2$, the same or different, each represent an alkylene group having 1 to 30 carbon atoms or a phenylene group. The $R^3$ to $R^6$, the same or different, each represent an alkyl group having 1 to 30 carbon atoms, a phenyl group or a phenoxy group. Examples of a preferred alkyl group having 1 to 30 carbon atoms include a methyl group, an ethyl group, a propyl group and a butyl group.

The average molecular weight of the polysiloxane diamine can be determined by performing neutralization titration of the amino groups of the polysiloxane diamine, calculating the amino group equivalent and then doubling the thus calculated amino group equivalent. For example, a prescribed amount of the polysiloxane diamine as a sample is collected and placed in a beaker and then dissolved in a prescribed amount of a 1:1 mixed solution of isopropyl alcohol (hereinafter, referred to as "IPA") and toluene. To the resulting solution, a 0.1 N aqueous hydrochloric acid solution is added dropwise with stirring, and the amino group equivalent can be calculated from the amount of the 0.1 N aqueous hydrochloric acid solution required for establishing the neutral point. A value obtained by doubling the amino group equivalent is the average molecular weight.

Meanwhile, the relationship between the value of n and the molecular weight can be obtained as a linear function equation by calculating the molecular weight of the polysiloxane diamine in use from its chemical structural formula for n=1 and n=10. The average value of n can be obtained by substituting the above-described average molecular weight into the linear function equation.

Further, since the polysiloxane diamine represented by Formula (1) does not always have a single value of n and may be a mixture having plural values of n, the n represents an average value. n is 45 to 200, preferably 50 to 100. When –n is 45 to 200, the polyimide resin can uniformly adhere a substrate used as an adherend over a large area, showing good adhesiveness.

Specific examples of the polysiloxane diamine represented by Formula (1) include α,ω-bis(3-aminopropyl)polydimethyl siloxane, α,ω-bis(3-aminopropyl)polydiethylsiloxane, α,ω-bis(3-aminopropyl)polydipropylsiloxane, α,ω-bis(3-aminopropyl)polydibutylsiloxane, α,ω-bis(3-aminopropyl)polydiphenoxysiloxane, α,ω-bis(2-aminoethyl)polydimethylsiloxane, α,ω-bis(2-aminoethyl)polydiphenoxysiloxane, α,ω-bis(4-aminobutyl)polydimethyl siloxane, α,ω-bis(4-aminobutyl)polydiphenoxysiloxane, α,ω-bis(5-aminopentyl)polydimethyl siloxane, α,ω-bis(5-aminopentyl)polydiphenoxysiloxane, α,ω-bis(4-aminophenyl)polydimethylsiloxane, and α,ω-bis(4-aminophenyl)polydiphenoxysiloxane. These polysiloxane diamines may be used individually or two or more thereof may be used in combination.

The polyimide resin contains a residue of the polysiloxane diamine represented by Formula (1) in an amount of not less than 60% by mole in the total amount of the diamine residue. The amount of the residue of the polysiloxane diamine represented by Formula (1) in the total amount of the diamine residue is more preferably 70% by mole to 99% by mole, still more preferably 80% by mole to 95% by mole. By incorporating the residue of the polysiloxane diamine represented by Formula (1) in an amount of not less than 60% by mole, the glass transition temperature of the polyimide resin can be controlled at 30° C. or lower and the polyimide resin is thus enabled to uniformly adhere a substrate used as an adherend over a large area even at room temperature, showing good adhesiveness.

It is preferred that the polyimide resin contain a residue of a hydroxyl group-containing diamine, more preferably a hydroxyl group-containing aromatic diamine, in the diamine residue. In the total amount of the diamine residue, the amount of the residue of hydroxyl group-containing diamine is 0.1% by mole to 40% by mole, preferably 0.5% by mole to 30% by mole. When the residue of hydroxyl group-containing diamine is contained in an amount of 0.1% by mole to 40% by mole, the polyimide resin shows good adhesiveness and, since an increase in its adhesive strength remains small even after a heat treatment step, it allows a substrate used as an adherend to be easily peeled off at room temperature.

Specific examples of the hydroxyl group-containing diamine include 2,5-diaminophenol, 3,5-diaminophenol, 3,3'-dihydroxybenzidine, 4,4'-dihydroxy-3,3'-diaminodiphenylpropane, 4,4'-dihydroxy-3,3'-diaminodiphenylhexafluoropropane, 4,4'-dihydroxy-3,3'-diaminodiphenylsulfone, 4,4'-dihydroxy-3,3'-diaminodiphenyl ether, 3,3'-dihydroxy-4,4'-diamino-diphenyl ether, 4,4'-dihydroxy-3,3'-diaminodiphenylpropanemethane, 4,4'-dihydroxy-3,3'-diaminobenzophenone, 1,3-bis(4-amino-3-hydroxyphenoxy)benzene, 1,3-bis(3-amino-4-hydroxyphenoxy)benzene, bis(4-(4-amino-3-hydroxyphenoxy)phenyl)propane, bis(4-(3-amino-4-hydroxyphenoxy)phenyl)sulfone, and bis(4-(3-amino-4-hydroxyphenoxy)biphenyl. These hydroxyl group-containing aromatic diamines may be used individually, or two or more thereof may be used in combination.

In addition to the residue of the polysiloxane diamine and the residue of the hydroxyl group-containing diamine, the polyimide resin may also contain a residue of an aromatic diamine or a residue of an alicyclic diamine. Specific examples of the aromatic diamine or the alicyclic diamine include p-phenylenediamine, m-phenylenediamine, 2,5-diaminotoluene, 2,4-diamino-toluene, 3,5-diaminobenzoic acid, 2,6-diaminobenzoic acid, 2-methoxy-1,4-phenylenediamine, 4,4'-diaminobenzanilide, 3,4'-diaminobenzanilide, 3,3'-diaminobenzanilide, 3,3'-dimethyl-4,4'-diaminobenzanilide, 9,9-bis(4-aminophenyl)fluorene, 9,9-bis(3-aminophenyl)fluorene, 9,9-bis(3-methyl-4-aminophenyl)fluorene, 9,9-bis(3,5-dimethyl-4-aminophenyl)fluorene, 9,9-bis(3-methoxy-4-aminophenyl)fluorene, 9,9-bis(4-aminophenyl)fluorene-4-carboxylic acid, 9,9-bis(4-aminophenyl)fluorene-4-methyl, 9,9-bis(4-aminophenyl)fluorene-4-methoxy, 9,9-bis(4-amino-phenyl)fluorene-4-ethyl, 9,9-bis(4-aminophenyl)fluorene-4-sulfone, 9,9-bis(4-aminophenyl)fluorene-3-carboxylic acid, 9,9-bis(4-aminophenyl)fluorene-3-methyl, 1,3-diaminocyclohexane, 2,2'-dimethylbenzidine, 3,3'-dimethylbenzidine, 3,3'-dimethoxybenzidine, 2,4-diaminopyridine, 2,6-diaminopyridine, 1,5-diaminonaphthalene, 2,7-diaminofluorene, p-aminobenzylamine, m-aminobenzylamine, 4,4'-bis(4-aminophenoxy)biphenyl, 4,4'-diaminodiphenyl ether, 3,3'-diaminodiphenyl ether, 3,4'-diaminodiphenyl ether, 4,4'-diaminodiphenylsulfone, 3,3'-diaminodiphenylsulfone, 3,3'-diaminodiphenylmethane, 4,4'-diaminodiphenylmethane, 4,4'-diaminodiphenylsulfide, 3,3'-diaminobenzophenone, 3,4'-diaminobenzophenone, 4,4'-diaminobenzophenone, 3,3'-dimethyl-4,4'-diaminodiphenylmethane, 1,3-bis(4-aminophenoxy)benzene, 1,3-bis(3-aminophenoxy)benzene, 1,4-bis(4-aminophenoxy)benzene, 1,4-bis(3-aminophen-oxy)benzene, 2,2-bis[4-(4-aminophenoxy)phenyl]propane, 2,2-bis[4-(3-aminophenoxy)phenyl]propane, bis[4-(4-aminophenoxy)phenyl]methane, bis[4-(3-aminophenoxy)phenyl]methane, bis[4-(4-aminophenoxy)phenyl]ether, bis[4-(3-aminophenoxy)phenyl]ether, bis[4-(4-amino-phenoxy)phenyl]sulfone, bis[4-(3-aminophenoxy)phenyl]sulfone, 2,2-bis[4-(4-aminophen-oxy)phenyl]hexafluoropropane, 1,4-diaminocyclohexane, 4,4'-methylenebis(cyclohexylamine), 3,3'-methylenebis(cyclohexylamine), 4,4'-diamino-3,3'-dimethyldicyclohexylmethane, 4,4'-diamino-3,3'-dimethyldicyclohexyl, and benzidine. These aromatic diamines or alicyclic diamines may be used individually, or two or more thereof may be used in combination.

Among these aromatic diamines or alicyclic diamines, aromatic diamines having a highly flexible structure are preferred and, specifically, 1,3-bis(3-aminophenoxy)benzene, 3,3'-diaminodiphenylsulfone, 4,4'-diaminodiphenyl ether, 3,3'-diaminodiphenyl ether and 3,3'-diaminobenzophenone are particularly preferred.

It is preferred that the polyimide resin contain a residue of an aromatic tetracarboxylic dianhydride as the acid dianhydride residue. Specific examples of the aromatic tetracarboxylic dianhydride include pyromellitic dianhydride, 3,3',4,4'-biphenyltetracarboxylic dianhydride, 2,2'-dimethyl-3,3',4,4'-biphenyltetracarboxylic dianhydride, 5,5'-dimethyl-3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-diphenyl ether tetracarboxylic dianhydride, 2,3,3',4'-diphenyl ether tetracarboxylic dianhydride, 2,2',3,3'-diphenyl ether tetracarboxylic dianhydride, 3,3',4,4'-benzophenonetetracarboxylic dianhydride, 2,2',3,3'-benzophenonetetracarboxylic dianhydride, 2,3,3',4'-benzophenonetetracarboxylic dianhydride, 3,3',4,4'-diphenylsulfonetetracarboxylic dianhydride, 2,3,3',4'-diphenylsulfonetetracarboxylic dianhydride, 3,3',4,4'-diphenylsulfoxide tetracarboxylic dianhydride, 3,3',4,4'-diphenyl sulfide tetracarboxylic dianhydride, 3,3',4,4'-diphenylmethylene tetracarboxylic dianhydride, 4,4'-isopropylidene diphthalic anhydride, 4,4'-(hexafluoroisopropylidene)diphthalic anhydride, 3,4,9,10-perylene tetracarboxylic dianhydride, 2,3,6,7-naphthalenetetracarboxylic dianhydride, 1,4,5,8-naphthalenetetracarboxylic dianhydride, 1,2,5,6-naphthalenetetracarboxylic dianhydride, 3,3",4,4"-paraterphenyltetracarboxylic dianhydride, 3,3",4,4"-metaterphenyltetracarboxylic dianhydride, 2,3,6,7-anthracenetetracarboxylic dianhydride, and 1,2,7,8-phenanthrenetetracarboxylic dianhydride. These aromatic tetracarboxylic dianhydrides may be used individually, or two or more thereof may be used in combination.

Further, an aliphatic ring-containing tetracarboxylic dianhydride may be incorporated to such an extent that does not impair the heat resistance of the polyimide resin. Specific examples of the aliphatic ring-containing tetracarboxylic dianhydride include 2,3,5-tricarboxycyclopentylacetic dianhydride, 1,2,3,4-cyclobutanetetracarboxylic dianhydride, 1,2,3,4-cyclopentanetetracarboxylic dianhydride, 1,2,3,5-cyclopentanetetracarboxylic dianhydride, 1,2,4,5-bicyclohexenetetracarboxylic dianhydride, 1,2,4,5-cyclohexanetetracarboxylic dianhydride, and 1,3,3a,4,5,9b-hexahydro-5-(tetrahydro-2,5-dioxo-3-furanyl)-naphtho[1,2-C]furan-1,3-dione. These tetracarboxylic dianhydrides may be used individually, or two or more thereof may be used in combination.

The molecular weight of the polyimide resin can be adjusted by using, in the synthesis of the polyimide resin, equimolar amounts of a tetracarboxylic acid component and a diamine component, or one of these components in an excess amount. It is also possible to use either one of the tetracarboxylic acid component and the diamine component in an excess amount and to cap a terminal of the resulting polymer chain with a terminal sealant such as an acid component or an amine component. As the terminal sealant which is an acid component, a dicarboxylic acid or an anhydride thereof is preferably used and, as the terminal sealant which is an amine component, a monoamine is preferably used. In this case, it is preferred that the acid equivalent of the tetracarboxylic acid component including the terminal sealant that is an acid component or an amine component and the amine equivalent of the diamine component be the same in terms of molar amount.

When the molar ratio is adjusted such that either the tetracarboxylic acid component or the diamine component is in excess, a dicarboxylic acid, an anhydride thereof or a monoamine such as benzoic acid, phthalic anhydride, tetrachlorophthalic anhydride or aniline, may be added as the terminal sealant.

The molar ratio (tetracarboxylic acid component/diamine component) of the polyimide resin can be adjusted as appropriate so that the viscosity of the resin solution is in a range where the resin solution can be easily used for coating and the like. The molar ratio, tetracarboxylic acid component/diamine component, is generally adjusted to 100/100 to 100/95 or 100/100 to 95/100. However, as the mole balance is broken, the molecular weight of the resin is decreased and this tends to cause a reduction in not only the mechanical strength but also the adhesive strength of a film formed from the resin; therefore, it is preferred that the molar ratio be adjusted within a range where the adhesive strength is not reduced.

The method of synthesizing the polyimide resin is not particularly restricted. For example, when a polyamic acid which is a precursor of the polyimide resin is polymerized, a tetracarboxylic dianhydride and a diamine are stirred in an organic solvent at 0 to 100° C. for 1 to 100 hours to obtain a polyamic acid resin solution. When the polyimide resin is soluble to an organic solvent, a polyamic acid is polymerized and the resultant is subsequently heated to a temperature of 120 to 300° C. and stirred for 1 to 100 hours to perform conversion thereof into a polyimide, thereby a polyimide resin solution is obtained. In this process, toluene, o-xylene, m-xylene, p-xylene or the like may be added to the reaction solution, and water generated by the imidization reaction may be azeotropically removed with such a solvent.

Examples of the solvent used in the synthesis of a polyimide or a polyamic acid which is a polyimide precursor include amide polar solvents such as N-methyl-2-pyrrolidone, N,N-dimethylacetamide and N,N-dimethylformamide; and lactone polar solvents such as β-propiolactone, γ-butyrolactone, γ-valerolactone, δ-valerolactone, γ-caprolactone and ε-caprolactone; as well as methyl cellosolve, methyl cellosolve acetate, ethyl cellosolve, ethyl cellosolve acetate, methylcarbitol, ethylcarbitol, diethylene glycol dimethyl ether (diglyme) and ethyl lactate. These solvents may be used individually, or two or more thereof may be used in combination. The concentration of the polyimide resin solution or polyamic acid resin solution is usually preferably 10 to 80% by mass, more preferably 20 to 70% by mass.

In the case of a polyamic acid resin solution, it is coated and dried on a substrate such as a film or glass to form a coating film, which is subsequently converted into a polyimide by a heat treatment. A temperature of 240° C. or higher is required for the conversion of a polyimide precursor into a polyimide. However, by incorporating an imidization catalyst into the polyamic acid resin composition, imidization can be carried out at a lower temperature in a shorter period of time. Specific examples of the imidization catalyst include, but not limited to, pyridine, trimethyl pyridine, β-picoline, quinoline, isoquinoline, imidazole, 2-methylimidazole, 1,2-dimethylimidazole, 2-phenylimidazole, 2,6-lutidine, triethylamine, m-hydroxybenzoic acid, 2,4-dihydroxybenzoic acid, p-hydroxyphenylacetic acid, 4-hydroxyphenylpropionic acid, p-phenol sulfonic acid, p-aminophenol and p-aminobenzoic acid.

The content of the imidization catalyst is preferably not less than 3 parts by mass, more preferably not less than 5 parts by mass, with respect to 100 parts by mass of polyamic acid solids. By incorporating the imidization catalyst in an amount of not less than 3 parts by mass, the imidization can be completed by a heat treatment at a lower temperature. The content of the imidization catalyst is preferably not greater than 10 parts by mass, more preferably not greater than 8 parts by mass. By controlling the content of the imidization catalyst to be 10 parts by mass or less, the amount of the imidization catalyst that remains in the resulting polyimide resin layer after the heat treatment can be minimized so that the generation of a volatile component can be inhibited.

The glass transition temperature of the polyimide resin is 30° C. or lower, preferably 20° C. or lower. When the glass transition temperature is 30° C. or lower, good adhesion is attained when a substrate used as an adherend is press-bonded with a cured film of the polyimide resin. The lower limit of the glass transition temperature is not particularly restricted. However, it is preferably −30° C. or higher, more preferably −20° C. or higher. When the glass transition temperature is −30° C. or higher, the polyimide resin has appropriate tackiness so that, for example, when a release-treated protective film is laminated, it can be easily peeled off.

The polyimide resin exhibits high heat resistance. The term "heat resistance" is defined by a decomposition onset temperature at which a volatile component is generated by decomposition or the like. The decomposition onset temperature is preferably 250° C. or higher, more preferably 300° C. or higher. The decomposition onset temperature can be measured using a thermogravimetric analyzer (TGA). The measurement method will now be described concretely. A prescribed amount of the subject polyimide resin is fed to a TGA and maintained at 60° C. for 30 minutes to remove water absorbed by the polyimide resin. Then, the temperature is raised to 500° C. at a rate of 5° C./min. From the resulting mass reduction curve, the temperature at which the mass reduction started is determined and defined as the decomposition onset temperature.

The resin composition comprises the above-described polyimide resin, or a polyamic acid resin which is a precursor of the polyimide resin.

The glass transition temperature of a film obtained by curing the resin composition is 30° C. or lower, preferably 20° C. or lower. The lower limit of the glass transition temperature is not particularly restricted. However, it is preferably −30° C. or higher, more preferably −20° C. or higher.

Further, a film obtained by curing the resin composition also exhibits high heat resistance.

It is preferred that the resin composition further comprise a methylol compound. The methylol compound is a compound functioning as a cross-linking agent to cross-link a polyimide resin during heat-curing and is incorporated into the polyimide resin. Since the methylol compound introduces a cross-linked structure into the resin and thereby reduces the fluidity of a cured film of the resin composition in a heat treatment step, an increase in the adhesive strength can be inhibited. Examples of a compound that can be used as such a cross-linking agent include compounds having two or more cross-linkable functional groups selected from the group consisting of a group represented by Formula (2), an epoxy group, a maleimide group, an oxetane group, an isocyanate group and an acryloyl group, among which a compound having two or more groups represented by Formula (2) is preferred:

   (2)

When a plurality of $R^7$s exist in the compound, the $R^7$s, the same or different, each represent hydrogen or an alkyl group having 1 to 10 carbon atoms. Specific examples of the alkyl group include a methyl group, an ethyl group, a propyl group, an isopropyl group, a butyl group, a hexyl group and a decyl group.

Specific examples of the methylol compound having two or more groups represented by Formula (2) include the following melamine derivatives and urea derivatives:

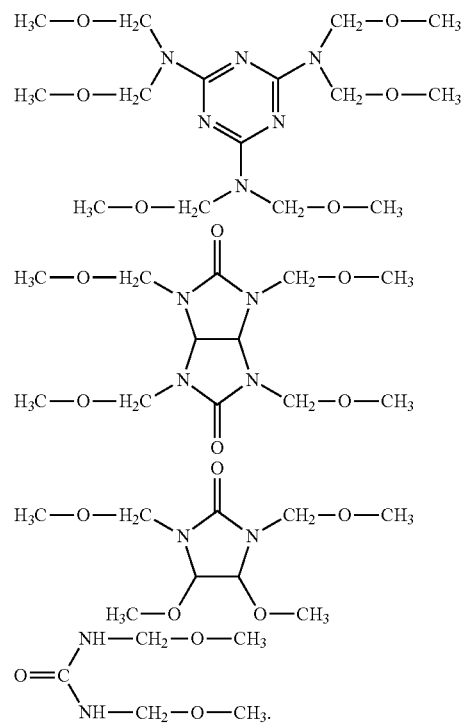

These four compounds of the above formulae are available from Sanwa Chemical Co., Ltd. under the following trade names:

Upper left: NIKALAC MW-30HM and NIKALAC MW-100LM

Upper right: NIKALAC MX-270

Lower left: NIKALAC MX-280

Lower right: NIKALAC MX-290.

By further incorporating such a methylol compound along with the polyimide resin which comprises a residue of a polysiloxane diamine represented by Formula (1) and a residue of a hydroxyl group-containing diamine into the resin composition, the fluidity of a cured film of the resin composition in a heat treatment step can be strongly suppressed and an increase in the adhesive strength can thus be inhibited. Therefore, a substrate used as an adherend can be more easily peeled off therefrom at room temperature.

In the resin composition, the content of the methylol compound is preferably 0.1 parts by mass to 20 parts by mass, more preferably 1 part by mass to 15 parts by mass, with respect to 100 parts by mass of a polyimide resin or a polyamic acid resin which is a precursor of the polyimide resin. By incorporating the methylol compound in an amount of 0.1 parts by mass to 20 parts by mass, since the resin composition is allowed to have good adhesiveness and an increase in its adhesive strength after the heat treatment step can be greatly inhibited, a substrate used as an adherend can be easily peeled off at room temperature.

To the resin composition, in addition to the polyimide resin and the methylol compound, other resin(s) and/or a filler can also be added within a range that does not adversely affect the desired effects. Examples of other resins include heat-resistant polymer resins such as acrylic resins, acrylonitrile resins, butadiene resins, urethane resins, polyester resins, polyamide resins, polyamide imide resins, epoxy resins and phenol resins. Examples of the filler include organic and inorganic fine particles and fillers. Specific examples of the fine particles and fillers include silica, alumina, titanium oxide, quartz powder, magnesium carbonate, potassium carbonate, barium sulfate, mica and talc. Further, for the purpose of improving the properties such as adhesiveness, heat resistance, coating performance and storage stability, for example, a surfactant and a silane coupling agent may also be added.

The laminated film can be mainly used as an adhesive laminated film and obtained by laminating the resin composition on one side or both sides of a heat-resistant insulation film. The laminated film can also be directly as an adhesive film. Further, the laminated film can also be used as an adhesive transfer film, which is used by press-bonding the adhesive layer of the laminated film to a glass substrate, a silicon substrate or the like and then peeling off only the heat-resistant insulation film to transfer the adhesive layer to the glass substrate, the silicon substrate or the like.

Examples of the heat-resistant insulation film include films made of an aromatic polyimide resin, a polyphenylene sulfide resin, an aromatic polyamide resin, a polyamide imide resin, an aromatic polyester resin or the like, among which polyimide films made of an aromatic polyimide resin are particularly preferred. Specific products of the polyimide films include "KAPTON" (registered trademark) manufactured by Du Pont-Toray Co., Ltd., "UPILEX" (registered trademark) manufactured by Ube Industries, Ltd., and "APICAL" (registered trademark) manufactured by Kaneka Corporation.

The thickness of the heat-resistant insulation film is not particularly restricted. However, from the standpoint of the strength as a support, it is preferably not less than 3 µm, more preferably not less than 5 µm, still more preferably not less than 10 µm. Further, from the standpoint of the flexibility, the thickness of the heat-resistant insulation film is preferably not greater than 150 µm, more preferably not greater than 75 µm, still more preferably not greater than 50 µm.

Examples of a method of coating the resin composition include methods using a bar coater, a roll coater, a knife coater, a comma coater, a reverse coater, a doctor blade float coater, a gravure coater, a slit die coater or the like. After the coating, the resin composition is heat-treated to remove the organic solvent contained therein and subsequently subjected to imidization. The heat treatment temperature is 100 to 300° C., preferably 150 to 250° C. The heat treatment time is usually selected as appropriate in a range of 20 seconds to 30 minutes, and the heat treatment may be performed continuously or intermittently. When the resin composition is laminated on both sides of the heat-resistant insulation film, the resin composition may be coated and dried on each side separately, or may be coated and dried on both sides simultaneously. As required, a release-treated film may be laminated on the surface of the thus coated resin composition.

The lamination thickness of the resin composition, which can be selected as appropriate, is 0.1 µm to 500 µm, preferably 1 µm to 100 µm, more preferably 2 µm to 70 µm.

When the laminated film is used as an adhesive tape, an adhesion-improving treatment may be performed on one side or both sides of the heat-resistant insulation film in accordance with the intended purpose. The adhesion-improving treatment is preferably an electrodischarge treatment such as normal-pressure plasma treatment, corona discharge treatment or low-temperature plasma treatment.

For press-bonding of the adhesive tape with other substrate, for example, a press or a roll laminator can be used. Although the press-bonding may be performed with application of heat, the press-bonding temperature is 200° C. or lower, preferably 120° C. or lower. The press-bonding is most preferably performed at a room temperature of 20 to 30° C. The press-bonding may be performed in the air or in nitrogen, preferably in a vacuum.

When the laminated film is used as an adhesive transfer film, a mold-release treatment may be performed on one side or both sides of the heat-resistant insulation film in accordance with the intended purpose. The mold-release treatment is preferably a coating treatment with a silicone resin, a fluorocarbon resin or the like.

For the transfer, the resin composition layer of the laminated film is pasted on a substrate such as a glass substrate and then press-bonded. Press-bonding can be performed using a press, a roll laminator or the like and, if necessary, the press-bonding may be performed with heating. In this case, the press-bonding temperature is 20° C. or higher but 200° C. or lower, preferably 180° C. or lower. The press-bonding may be performed in the air or in nitrogen, preferably in a vacuum.

Press-bonding of the thus transferred resin composition layer with other substrate is performed using a press, a roll laminator or the like after peeling off the heat-resistant insulation film. The press-bonding may be performed under an increased temperature, and the press-bonding temperature is 200° C. or lower, preferably 120° C. or lower. The press-bonding is most preferably performed at a room temperature of 20 to 30° C. The press-bonding may be performed in the air or in nitrogen, preferably in a vacuum.

The resin composition may also be directly coated and dried on a glass substrate, a silicon substrate or the like. Examples of a coating method include screen printing and methods using a spin coater, a gravure coater, a slit die coater, a bar coater or the like.

The resin composition can also be used in the production of a semiconductor device, particularly a technology of laminating a semiconductor chip while forming connections using through-silicon vias (TSV: Through-Silicon Via) for the purpose of increasing the integration and density of a semiconductor element. This technology requires the resulting package to be thin and thus comprises the step of thinning a semiconductor circuit-formed substrate to a thickness of 100 µm or less. As a substrate for semiconductor circuit formation, a silicon wafer is generally used.

Thinning of a silicon wafer to a thickness of 100 µm or less makes it difficult to transport the silicon wafer. Therefore, a substrate for semiconductor circuit formation is adhered on a support substrate such as a silicon wafer using an adhesive or the like and, after grinding a non-circuit-forming surface (back surface) of this substrate for semiconductor circuit formation to form a back-surface electrode thereon, the substrate for semiconductor circuit formation is peeled off. The resin composition can be suitably used as an adhesive in the production of a semiconductor device that comprises the above-described steps.

Examples of a method of coating the resin composition on a support substrate include screen printing and methods using a spin coater, a roll coater, a slit die coater or the like. Post-coating drying can be achieved by continuously or intermittently performing a heat treatment at 100 to 300° C., usually for 20 seconds to 1 hour. Further, using a laminated film obtained by coating and drying the resin composition on a release-treated base film, a coating film of the resin composition may be transferred and laminated onto a silicon wafer which is a support substrate. After the resin composition is laminated, the resultant may further be subjected to a eat treatment at 180 to 350° C. for 30 seconds to 1 hour.

Not only the resin composition may be coated and laminated on a support substrate, but also the resin composition may be coated and laminated on a substrate for semiconductor circuit formation, and a coating film of the resin composition may be transferred and laminated onto a substrate for semiconductor circuit formation using the laminated film. Further, on the side of the support substrate or the side of the substrate for semiconductor circuit formation, a layer composed of other resin composition may be present.

Examples of a method of peeling off a semiconductor circuit-formed substrate include, but not limited to, a thermal slide-peeling method, a laser irradiation peeling method, and a mechanical peeling method performed at room temperature. The thermal slide-peeling method is a method of peeling off the semiconductor circuit-formed substrate while applying heat thereto at 100 to 200° C. In the laser irradiation peeling method, a glass substrate is used as the support substrate. In this peeling method, a laser beam is irradiated to the entire surface to peel off the semiconductor circuit-formed substrate from the glass substrate. The mechanical peeling method performed at room temperature refers to a method of mechanically and slowly peeling off the semiconductor circuit-formed substrate from an edge of a substrate at room temperature.

After the peeling step, in cases where an adhesive or its residue remains on the semiconductor circuit-formed substrate, it may be removed by washing with an organic solvent, an aqueous alkaline solution or the like.

EXAMPLES

Our resins, compositions and films will now be described by way of examples thereof. However, this disclosure is not restricted thereto. Methods of evaluating the glass transition temperature, mass reduction rate, adhesive strength and adhesion uniformity will also be described.
(1) Measurement of Glass Transition Temperature On a glossy surface of a 18 μm-thick electrolytic copper foil, the below-described polyamic acid resin solutions (PA-1 to 22) of Production Examples 1 to 22 and adhesive resin solutions of Production Examples 23 to 29 were each coated at a thickness of 20 μm using a bar coater and dried at 80° C. for 10 minutes and then at 150° C. for 10 minutes. Each resultant was subsequently subjected to a 10-minute heat treatment at 250° C. under nitrogen atmosphere, thereby converting the coated resin into polyimide to obtain an adhesive resin-laminated copper foil. The entire surface of the thus obtained adhesive resin-laminated copper foil was etched with a ferric chloride solution to obtain an adhesive resin monolayer film.

About 10 mg of the thus obtained adhesive resin monolayer film was put into a standard aluminum pan and then measured (DSC method) using a differential scanning calorimeter DSC-50 (manufactured by Shimadzu Corporation). The glass transition temperature was calculated from the inflection point of the resulting DSC curve. The measurement was performed at a heating rate of 20° C./min after preliminary drying the sample at 80° C. for 1 hour.
(2) Measurement of Thermal Decomposition Onset Temperature About 15 mg of the adhesive resin monolayer film obtained above was put into a standard aluminum pan and measured using a thermogravimetric analyzer TGA-50 (manufactured by Shimadzu Corporation). As for the measurement conditions, the temperature was maintained at 60° C. for 30 minutes and then raised to 500° C. at a rate of 5° C./min.

From the thus obtained weight reduction curve, the temperature at which weight reduction started was determined, and this temperature was defined as the thermal decomposition onset temperature.
(3) Measurement of Adhesive Strength (Before Heat Treatment/after 300° C. Heat Treatment)

Cuts were made at a width of 10 mm on the polyimide film of the polyimide film-laminated silicon substrate obtained in each of the Examples and Comparative Examples, and the measurement was performed by peeling off the resulting 10 mm-wide polyimide film at a pull rate of 50 mm/min at an angle of 90° using "TENSILON" UTM-4-100 manufactured by Toyo Boldwin Co., Ltd.

Further, after heat-treating each polyimide film-laminated silicon substrate obtained in the Examples and Comparative Examples at 300° C. for 30 minutes using a hot-air oven and subsequently cooling the substrate back to room temperature, the adhesive strength after 300° C. heat treatment was measured in the same manner as described above.
(4) Evaluation of Adhesion Uniformity The glass substrate-laminated silicon substrates obtained in the Examples were each observed from the glass substrate side by visual inspection to evaluate the presence or absence of a void. The evaluation criteria were as follows:

A: No void was observed.

B: A void having a size of 100 μm or smaller was observed.

C: A void having a size of 100 μm or larger was observed.
(5) Measurement of Average Molecular Weight of Polysiloxane Diamine and Calculation of Value of "n"

A sample polysiloxane diamine in an amount of 5 g was placed in a beaker and 50 mL of a 1:1 mixed solution of IPA and toluene added thereto to dissolve the sample. Then, a 0.1 N aqueous hydrochloric acid solution was added thereto dropwise with stirring using an automatic potentiometer AT-610 manufactured by Kyoto Electronics Manufacturing Co., Ltd., and the amount of the acid solution required to be added for establishing the neutral point was determined. From the thus determined amount of the 0.1 N aqueous hydrochloric acid solution, the average molecular weight was calculated using equation (7):

$$2\times[10\times36.5\times(\text{Amount of added 0.1 N aqueous hydrochloric acid solution (g)})]/5=\text{Average molecular weight} \qquad (7).$$

Next, the molecular weight of the polysiloxane diamine in use was calculated from its chemical structural formula for n=1 and n=10, and the relationship between the value of n and the molecular weight was determined as a linear function equation. The average value of n was determined by substituting the above-described average molecular weight into this linear function equation.

The abbreviations indicated in the below-described Production Examples represent the following acid anhydrides, diamines, methylol compounds and solvents:

BPDA: 3,3',4,4'-biphenyltetracarboxylic dianhydride

ODPA: 3,3',4,4'-diphenylether tetracarboxylic dianhydride

BTDA: 3,3',4,4'-benzophenone tetracarboxylic dianhydride

APPS1: α,ω-bis(3-aminopropyl)polydimethylsiloxane (average molecular weight: 860, n=9 in the Formula (1))
APPS2: α,ω-bis(3-aminopropyl)polydimethylsiloxane (average molecular weight: 3,000, n=37 in the Formula (1))
APPS3: α,ω-bis(3-aminopropyl)polydimethylsiloxane (average molecular weight: 3,700, n=47 in the Formula (1))
APPS4: α,ω-bis(3-aminopropyl)polydimethylsiloxane (average molecular weight: 4,400, n=57 in the Formula (1))
44DAE: 4,4'-diaminodiphenyl ether
APB: 1,3-bis(3-aminophenoxy)benzene
35DAP: 3,5-diaminophenol
BAP: 4,4'-dihydroxy-3,3'-diaminophenylpropane
DABS: 4,4'-dihydroxy-3,3'-diaminophenylsulfone
AHPB: 1,3-bis(4-amino-3-hydroxyphenyl)benzene
BAHF: 4,4'-dihydroxy-3,3'-diaminophenylhexafluoropropane
BAHPS: bis(4-(3-amino-4-hydroxyphenoxy)benzene)sulfone
100LM: NIKALAC (registered trademark) MW-100LM (manufactured by Sanwa Chemical Co., Ltd.)
MX270: NIKALAC (registered trademark) MX-270 (manufactured by Sanwa Chemical Co., Ltd.)
CCH: cyclohexanone.

Production Example 1 (Polymerization of Polyamic Acid Solution)

To a reaction kettle equipped with a thermometer, a dry nitrogen inlet, a heating/cooling apparatus using hot/cooling water and a stirrer, 688 g (0.8 mol) of APPS1, 20 g (0.1 mol) of 44DAE and 25.8 g (0.1 mol) of BAP were fed along with 1,566 g of CCH. After dissolving these materials, 310.2 g (1 mol) of ODPA was added, and the resulting mixture allowed to react at room temperature for 1 hour and then at 60° C. for 5 hours, thereby a polyamic acid resin solution having a concentration of 40% by mass (PA1) was obtained.

Production Examples 2 to 22 (Polymerization of Polyamic Acid Solution)

Polyamic acid resin solutions having a concentration of 40% by mass (PA2 to PA22) were obtained in the same manner as in Production Example 1, except that the types and amounts of the acid dianhydride and diamine were changed as shown in Tables 1 and 2.

TABLE 1

Top row: the composition ratio (% by mol)/Bottom row: the amount used (g)

| | | Acid dianhydride | Diamine | | | | | | | | Solvent (g) |
|---|---|---|---|---|---|---|---|---|---|---|---|
| | | ODPA | APPS1 | APPS2 | APPS3 | APPS4 | 44DAE | APB | BAP | DABS | CCH |
| Production Example 1 | PA1 | 100 | 80 | | | | 10 | | 10 | | 1,566 |
| | | 310.2 | 688 | | | | 20.0 | | 25.8 | | |
| Production Example 2 | PA2 | 100 | | 80 | | | 10 | | 10 | | 4,134 |
| | | 310.2 | | 2,400 | | | 20.0 | | 25.8 | | |
| Production Example 3 | PA3 | 100 | | | 80 | | 10 | | 10 | | 4,974 |
| | | 310.2 | | | 2,960 | | 20.0 | | 25.8 | | |
| Production Example 4 | PA4 | 100 | | | | 80 | 10 | | 10 | | 5,814 |
| | | 155.1 | | | | 3,520 | 20.0 | | 25.8 | | |
| Production Example 5 | PA5 | 100 | | | 55 | 35 | 10 | | | | 3,662 |
| | | 620.4 | | | 2,035 | 70.1 | 25.8 | | | | |
| Production Example 6 | PA6 | 100 | | | 65 | 25 | 10 | | | | 4,187 |
| | | 620.4 | | | 2,405 | 50.1 | 25.8 | | | | |
| Production Example 7 | PA7 | 100 | | | 75 | 15 | 10 | | | | 4,712 |
| | | 310.2 | | | 2,775 | 30.0 | 25.8 | | | | |
| Production Example 8 | PA8 | 100 | | | 85 | 5 | 10 | | | | 5,237 |
| | | 310.2 | | | 3,145 | 10.0 | 25.8 | | | | |
| Production Example 9 | PA9 | 100 | | | 90 | | | 10 | | | 5,499 |
| | | 310.2 | | | 3,330 | | | 25.8 | | | |
| Production Example 10 | PA10 | 100 | | | | 85 | 5 | | 10 | | 6,129 |
| | | 310.2 | | | | 3,740 | 10.0 | | 25.8 | | |
| Production Example 11 | PA11 | 100 | | | | 80 | 20 | | | | 5,833 |
| | | 310.2 | | | | 3,520 | 58.5 | | | | |
| Production Example 12 | PA12 | 100 | | | | 80 | 19.8 | | | 0.2 | 5,833 |
| | | 310.2 | | | | 3,520 | 57.9 | | | 0.6 | |
| Production Example 13 | PA13 | 100 | | | | 80 | 19 | | | 1 | 5,833 |
| | | 310.2 | | | | 3,520 | 55.5 | | | 2.8 | |
| Production Example 14 | PA14 | 100 | | | | 80 | 15 | | | 5 | 5,832 |
| | | 310.2 | | | | 3,520 | 43.8 | | | 14.0 | |
| Production Example 15 | PA15 | 100 | | | | 80 | 10 | | | 10 | 5,831 |
| | | 310.2 | | | | 3,520 | 29.2 | | | 28.0 | |
| Production Example 16 | PA16 | 100 | | | | 70 | 5 | | | 25 | 5,212 |
| | | 310.2 | | | | 3,080 | 14.6 | | | 70.1 | |

TABLE 2

Top row: the composition ratio (% by mol)/Bottom row: the amount used (g)

| | | Acid dianhydride | | Diamine | | | | | | Solvent (g) |
|---|---|---|---|---|---|---|---|---|---|---|
| | | BPDA | BTDA | APPS3 | APB | AHPB | BAHF | 35DAP | BAHPS | CCH |
| Production Example 19 | PA17 | 100 | | 80 | 5 | 15 | | | | 4,976 |
| | | 294.2 | | 2,960 | 14.6 | 48.6 | | | | |
| Production Example 20 | PA18 | 100 | | 80 | 5 | | 15 | | | 4,986 |
| | | 294.2 | | 2,960 | 14.6 | | 54.9 | | | |
| Production Example 21 | PA19 | | 100 | 80 | 5 | | | 15 | | 4,945 |
| | | | 322.2 | 2,960 | 14.6 | | | 18.6 | | |
| Production Example 22 | PA20 | | 100 | 80 | 5 | | | | 15 | 4,945 |
| | | | 322.2 | 2,960 | 14.6 | | | | 69.7 | |

Production Example 23 (Preparation of Adhesive Resin Solution)

To a reaction kettle equipped with a stirrer, 100 g of the polyamic acid solution (PA15) obtained in Production Example 15 and 0.08 g of a methylol compound 100LM were fed along with 0.12 g of CCH. These materials were stirred at room temperature for 2 hours to obtain an adhesive resin solution having a concentration of 40% by mass (AH1).

Production Examples 24 to 29 (Preparation of Adhesive Resin Solution)

Adhesive resin solutions having a concentration of 40% by mass (AH2 to AH7) were obtained in the same manner as in Production Example 23, except that the type and amount of the methylol compound were changed as shown in Table 3.

TABLE 3

| | | Polyamic acid solution | | Methylol compound | | |
|---|---|---|---|---|---|---|
| | | Type | Amount used (g) | Type | Amount used (g) | Solvent CCH (g) |
| Production Example 23 | AH1 | PA15 | 100 | 100LM | 0.08 | 0.12 |
| Production Example 24 | AH2 | PA15 | 100 | 100LM | 0.8 | 1.2 |
| Production Example 25 | AH3 | PA15 | 100 | 100LM | 2.0 | 3.0 |
| Production Example 26 | AH4 | PA15 | 100 | 100LM | 4.0 | 6.0 |
| Production Example 27 | AH5 | PA15 | 100 | 100LM | 6.0 | 9.0 |
| Production Example 28 | AH6 | PA15 | 100 | 100LM | 10.0 | 15.0 |
| Production Example 29 | AH7 | PA15 | 100 | MX270 | 4.0 | 6.0 |

Example 1

On a 0.75 mm-thick 8-inch silicon wafer (manufactured by Shin-Etsu Chemical Co., Ltd.), the polyamic acid resin solution (PA3) obtained in Production Example 3 was coated using a spin coater while adjusting its rotation speed such that the thickness would be 20 μm after drying and imidization. The thus coated resin solution was dried by a 10-minute heat treatment at 120° C., and the resin completely imidized by a subsequent 10-minute heat treatment at 250° C. to obtain an adhesive resin-laminated silicon substrate.

On the adhesive resin-laminated silicon substrate prepared by the above-described method, a polyimide film ("KAPTON" 150EN, manufactured by Du Pont-Toray Co., Ltd.) was overlaid and then press-bonded using a hand roll at 25° C. to obtain a polyimide film-laminated silicon substrate. The thus obtained polyimide film-laminated silicon substrate was heat-treated for 30 minutes in a hot-air oven set at 300° C. The adhesive strength of the polyimide film-laminated silicon substrate after the press-bonding but before the heat-treatment, the adhesive strength of the polyimide film-laminated silicon substrate after the heat treatment, and the glass transition temperature and thermal decomposition onset temperature of the adhesive resin are summarized in Table 4.

Further, on the adhesive resin-laminated silicon substrate prepared by the above-described method, a 0.7 mm-thick 8-inch alkali-free glass substrate (manufactured by Corning Inc.) was overlaid and then press-bonded for 5 minutes with a load of 2,000 N or 4,000 N using a heat press whose top and bottom plates were both set at 180° C., thereby a glass substrate-laminated silicon substrate was obtained. The results of observing the adhesion uniformity are summarized in Table 4.

Example 2

A polyimide film-laminated glass substrate and a glass substrate-laminated silicon substrate were obtained in the same manner as in Example 1, except that the polyamic acid resin solution was changed as shown in Table 4.

The adhesive strength of the thus obtained polyimide film-laminated silicon substrate after the press-bonding but before the heat-treatment, the adhesive strength of the polyimide film-laminated silicon substrate after the heat treatment, and the glass transition temperature and thermal decomposition onset temperature of the adhesive resin, as well as the results of observing the adhesion uniformity of the glass substrate-laminated silicon substrate are summarized in Table 4.

Comparative Examples 1 and 2

Each polyimide film-laminated glass substrate and glass substrate-laminated silicon substrate were obtained in the same manner as in Example 1, except that the polyamic acid resin solution was changed as shown in Table 4.

The adhesive strength of the thus obtained polyimide film-laminated silicon substrate after the press-bonding but before the heat-treatment, the adhesive strength of the polyimide film-laminated silicon substrate after the heat treatment, and the glass transition temperature and thermal decomposition onset temperature of the adhesive resin, as well as the results of observing the adhesion uniformity of the glass substrate-laminated silicon substrate are summarized in Table 4.

TABLE 4

| | Resin solution | Polysiloxane diamine | | OH group-containing diamine (% by mol) | Tg (° C.) | Thermal decomposition onset temperature (° C.) | Adhesion uniformity | | Adhesive strength (g/cm) | |
| | | n in Formula (1) | Content (% by mol) | | | | 2,000 N | 4,000 N | After press-bonding, before heat treatment | After 300° C. heat treatment |
|---|---|---|---|---|---|---|---|---|---|---|
| Example 1 | PA3 | 47 | 80 | 10 | 12 | >300 | A | A | 10 | 120 |
| Example 2 | PA4 | 57 | 80 | 10 | 12 | >300 | A | A | 14 | 100 |
| Comparative Example 1 | PA1 | 9 | 80 | 10 | 15 | >300 | C | C | 5 | 150 |
| Comparative Example 2 | PA2 | 37 | 80 | 10 | 14 | >300 | C | C | 6 | 140 |

According to these Examples, the adhesive compositions containing a polyimide having a polysiloxane diamine residue with n of 45 or larger in Formula (1) exhibited good adhesiveness and adhesion uniformity over a large area. In contrast, in Comparative Examples, a large void of 100 μm or larger was observed and uniform adhesion was not attained.

Examples 3 to 7

Each polyimide film-laminated silicon substrate and glass substrate-laminated silicon substrate were obtained in the same manner as in Example 1, except that the polyamic acid resin solution was changed as shown in Table 5.

The adhesive strength of the thus obtained polyimide film-laminated silicon substrate after the press-bonding but before the heat-treatment, the adhesive strength of the polyimide film-laminated silicon substrate after the heat treatment, and the glass transition temperature and thermal decomposition onset temperature of the adhesive resin, as well as the results of observing the adhesion uniformity of the glass substrate-laminated silicon substrate are summarized in Table 5.

Comparative Example 3

Each polyimide film-laminated silicon substrate and glass substrate-laminated silicon substrate were obtained in the same manner as in Example 1, except that the polyamic acid resin solution was changed as shown in Table 5.

The adhesive strength of the thus obtained polyimide film-laminated silicon substrate after the press-bonding but before the heat-treatment, the adhesive strength of the polyimide film-laminated silicon substrate after the heat treatment, and the glass transition temperature and thermal decomposition onset temperature of the adhesive resin, as well as the results of observing the adhesion uniformity of the glass substrate-laminated silicon substrate are summarized in Table 5.

TABLE 5

| | Resin solution | Polysiloxane diamine | | OH group-containing diamine (% by mol) | Tg (° C.) | Thermal decomposition onset temperature (° C.) | Adhesion uniformity | | Adhesive strength (g/cm) | |
| | | n in Formula (1) | Content (% by mol) | | | | 2,000 N | 4,000 N | After press-bonding, before heat treatment | After 300° C. heat treatment |
|---|---|---|---|---|---|---|---|---|---|---|
| Example 3 | PA6 | 47 | 65 | 10 | 29 | >300 | A | A | 5 | 110 |
| Example 4 | PA7 | 47 | 75 | 10 | 15 | >300 | A | A | 8 | 110 |
| Example 5 | PA8 | 47 | 85 | 10 | -2 | >300 | A | A | 10 | 120 |
| Example 6 | PA9 | 47 | 90 | 10 | -4 | >300 | A | A | 12 | 120 |
| Example 7 | PA10 | 57 | 85 | 10 | -4 | >300 | A | A | 15 | 120 |
| Comparative Example 3 | PA5 | 47 | 55 | 10 | 40 | >300 | C | C | <1 | 110 |

According to these Examples, the adhesive compositions composed of a polyimide containing 60% by mass or more of a polysiloxane diamine residue represented by Formula (1) exhibited good adhesiveness and adhesion uniformity over a large area. In contrast, in Comparative Examples, a large void of 100 μm or larger was observed and uniform adhesion was not attained. In addition, the adhesive strength before the 300° C. heat treatment was very low.

The adhesive strength of the thus obtained polyimide film-laminated silicon substrate after the press-bonding but before the heat-treatment, the adhesive strength of the polyimide film-laminated silicon substrate after the heat treatment, and the glass transition temperature and thermal decomposition onset temperature of the adhesive resin, as well as the results of observing the adhesion uniformity of the glass substrate-laminated silicon substrate are summarized in Table 6.

TABLE 6

| | Resin solution | Polysiloxane diamine | | OH group-containing diamine (% by mol) | Tg (° C.) | Thermal decomposition onset temperature (° C.) | Adhesion uniformity | | Adhesive strength (g/cm) | |
|---|---|---|---|---|---|---|---|---|---|---|
| | | n in the Formula (1) | Content (% by mol) | | | | 2,000 N | 4,000 N | After press-bonding, before heat treatment | After 300° C. heat treatment |
| Example 8 | PA11 | 57 | 80 | 0 | 9 | >300 | A | A | 14 | 1000 |
| Example 9 | PA12 | 57 | 80 | 0.2 | 9 | >300 | A | A | 14 | 600 |
| Example 10 | PA13 | 57 | 80 | 1 | 10 | >300 | A | A | 13 | 300 |
| Example 11 | PA14 | 57 | 80 | 5 | 12 | >300 | A | A | 11 | 200 |
| Example 12 | PA15 | 57 | 80 | 10 | 12 | >300 | A | A | 11 | 100 |
| Example 13 | PA16 | 57 | 70 | 25 | 18 | >300 | A | A | 7 | 80 |
| Example 14 | PA17 | 57 | 60 | 35 | 30 | >300 | A | A | 3 | 70 |
| Comparative Example 4 | PA18 | 57 | 55 | 45 | 43 | >300 | C | C | <1 | 50 |

Examples 8 to 14

Each polyimide film-laminated silicon substrate and glass substrate-laminated silicon substrate were obtained in the same manner as in Example 1, except that the polyamic acid resin solution was changed as shown in Table 6.

The adhesive strength of the thus obtained polyimide film-laminated silicon substrate after the press-bonding but before the heat-treatment, the adhesive strength of the polyimide film-laminated silicon substrate after the heat treatment, and the glass transition temperature and thermal decomposition onset temperature of the adhesive resin, as well as the results of observing the adhesion uniformity of the glass substrate-laminated silicon substrate are summarized in Table 6.

Comparative Example 4

A polyimide film-laminated silicon substrate and glass substrate-laminated silicon substrate were obtained in the same manner as in Example 1, except that the polyamic acid resin solution was changed as shown in Table 6.

Examples 15 to 18

Each polyimide film-laminated silicon substrate and glass substrate-laminated silicon substrate were obtained in the same manner as in Example 1, except that the polyamic acid resin solution was changed as shown in Table 7.

The adhesive strength of the thus obtained polyimide film-laminated silicon substrate after the press-bonding but before the heat-treatment, the adhesive strength of the polyimide film-laminated silicon substrate after the heat treatment, and the glass transition temperature and thermal decomposition onset temperature of the adhesive resin, as well as the results of observing the adhesion uniformity of the glass substrate-laminated silicon substrate are summarized in Table 7.

TABLE 7

| | Resin solution | Polysiloxane diamine | | OH group-containing diamine (% by mol) | Tg (° C.) | Thermal decomposition onset temperature (° C.) | Adhesion uniformity | | Adhesive strength (g/cm) | |
|---|---|---|---|---|---|---|---|---|---|---|
| | | n in the Formula (1) | Content (% by mol) | | | | 2,000 N | 4,000 N | After press-bonding, before heat treatment | After 300° C. heat treatment |
| Example 15 | PA19 | 47 | 80 | 15 | 14 | >300 | A | A | 8 | 90 |
| Example 16 | PA20 | 47 | 80 | 15 | 14 | >300 | A | A | 8 | 90 |
| Example 17 | PA21 | 47 | 80 | 15 | 12 | >300 | A | A | 8 | 90 |
| Example 18 | PA22 | 47 | 80 | 15 | 12 | >300 | A | A | 8 | 90 |

Examples 19 to 25

Each polyimide film-laminated silicon substrate and glass substrate-laminated silicon substrate were obtained in the same manner as in Example 1, except that the adhesive resin acid solution was changed as shown in Table 8.

The adhesive strength of the thus obtained polyimide film-laminated silicon substrate after the press-bonding but before the heat-treatment, the adhesive strength of the polyimide film-laminated silicon substrate after the heat treatment, and the glass transition temperature and thermal decomposition onset temperature of the adhesive resin, as well as the results of observing the adhesion uniformity of the glass substrate-laminated silicon substrate are summarized in Table 8.

tion (AH4) obtained in Production Example 26 was coated using a spin coater such that the thickness would be 20 µm after drying and imidization. The resultant was heat-treated at 140° C. for 10 minutes and then at 250° C. for 30 minutes to obtain an adhesive resin-laminated support substrate.

TABLE 8

|  | Resin solution | Polysiloxane diamine | | OH group-containing diamine (% by mol) | Methylol compound | | Tg (° C.) | Thermal decomposition onset temperature (° C.) | Adhesion uniformity | | Adhesive strength (g/cm) | |
|---|---|---|---|---|---|---|---|---|---|---|---|---|
|  |  | n in the Formula (1) | Content (% by mol) |  | Type | Content (% by weight) |  |  | 2,000 N | 4,000 N | After press-bonding, before heat treatment | After 300° C. heat treatment |
| Example 19 | AH1 | 57 | 80 | 10 | 100LM | 0.2 | 12 | >300 | A | A | 11 | 90 |
| Example 20 | AH2 | 57 | 80 | 10 | 100LM | 2 | 13 | >300 | A | A | 9 | 70 |
| Example 21 | AH3 | 57 | 80 | 10 | 100LM | 5 | 13 | >300 | A | A | 7 | 50 |
| Example 22 | AH4 | 57 | 80 | 10 | 100LM | 10 | 14 | >300 | A | A | 7 | 40 |
| Example 23 | AH5 | 57 | 80 | 10 | 100LM | 15 | 14 | >300 | B | A | 5 | 30 |
| Example 24 | AH6 | 57 | 80 | 10 | 100LM | 25 | 16 | >300 | C | A | 2 | 30 |
| Example 25 | AH7 | 57 | 80 | 10 | MX270 | 10 | 14 | >300 | A | A | 6 | 50 |

Example 26

On a 100 µm-thick, 250 mm-wide polyimide film ("KAPTON" 300H, manufactured by Du Pont-Toray Co., Ltd.) which had been release-treated with a silicone resin, the adhesive resin solution (AH4) obtained in Production Example 26 was coated using a comma coater such that the thickness would be 20 µm after drying and imidization. The resultant was heat-treated at 120° C. for 1 minute and then at 250° C. for 1 minute to obtain an adhesive resin-laminated film having an adhesive resin layer on one side. Then, on this adhesive resin layer, a 38 µm-thick, 250 mm-wide PET film which had been release-treated with a silicone resin was laminated at 25° C., thereby a protective film-equipped adhesive resin-laminated film was obtained.

After cutting out the thus obtained protective film-equipped adhesive resin-laminated film into a prescribed size, the protective PET film was peeled off and, on a 0.7 mm-thick alkali-free glass substrate (manufactured by Corning Inc.) placed on a hot plate whose surface temperature was set at 120° C., the adhesive resin-laminated film was press-bonded using a hand roll. Then, the polyimide film was peeled off to obtain an adhesive resin-laminated glass substrate. When the surface of the thus peeled polyimide film was observed, no residue of the adhesive resin was found on the surface.

On the adhesive resin-laminated glass substrate prepared by the above-described method, a polyimide film ("KAPTON" 150EN, manufactured by Du Pont-Toray Co., Ltd.) was overlaid and then press-bonded at 160° C. using a hand roll to obtain a polyimide film-laminated glass substrate. The thus obtained polyimide film-laminated glass substrate had an adhesive strength of 12 g/cm. Then, this polyimide film-laminated glass substrate was heat-treated at 300° C. for 15 minutes using a hot-air oven. After the heat treatment, the adhesive strength was 47 g/cm and the polyimide film was easily peelable at room temperature.

Example 27

On a 0.75 mm-thick 8-inch silicon wafer (manufactured by Shin-Etsu Chemical Co., Ltd.), the adhesive resin solution (AH4) obtained in Production Example 26 was coated using a spin coater such that the thickness would be 20 µm after drying and imidization. The resultant was heat-treated at 140° C. for 10 minutes and then at 250° C. for 30 minutes to obtain an adhesive resin-laminated support substrate.

On the adhesive resin of the thus obtained adhesive resin-laminated support substrate, a 0.75 mm-thick 8-inch silicon wafer was laminated and press-bonded for 5 minutes at 180° C. with a load of 4,000 N to obtain a laminate of substrate for semiconductor circuit formation/adhesive resin layer/support substrate The substrate for semiconductor circuit formation of the thus obtained laminate was set on a grinder DAG810 (manufactured by DISCO Corporation) and ground to a thickness of 100 µm. Thereafter, the laminate was heat-treated at 300° C. for 1 hour. When the substrate for semiconductor circuit formation of this laminate was observed by visual inspection, no swelling, fracture, cracking or the like was found.

Next, using a dicing frame, a dicing tape was pasted onto the substrate for semiconductor circuit formation. After setting the surface of this dicing tape on a suction pad by vacuum adsorption, the support substrate was peeled off at room temperature by picking up a portion thereof with a forceps. No fracture, cracking or the like was found on this substrate for semiconductor circuit formation.

Example 28

After peeling off the protective PET film from the protective film-equipped adhesive resin-laminated film prepared in Example 26, on a 0.75 mm-thick 8-inch silicon wafer (manufactured by Shin-Etsu Chemical Co., Ltd.) placed on a hot plate whose surface temperature was set at 120° C., the adhesive resin-laminated film was press-bonded using a hand roll. Then, the polyimide film was peeled off and the resultant was heat-treated at 250° C. for 30 minutes to obtain an adhesive resin-laminated support substrate.

Thereafter, the same operations as in Example 27 were performed. After the support substrate was peeled off, no fracture, cracking or the like was found on the substrate for semiconductor circuit formation.

The invention claimed is:
1. A polyimide resin comprising:
an acid anhydride residue;
a diamine residue; and
a residue of a hydroxyl group-containing diamine in said diamine residue, said polyimide resin comprising a residue of a polysiloxane diamine represented by Formula (1) in an amount of not less than 60% by mole in the total amount of said diamine residue:

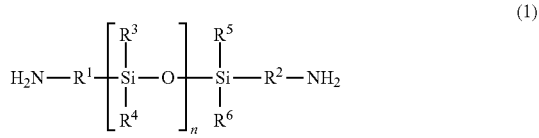

wherein, n is a number of siloxane units and an average value thereof calculated from the average molecular weight of said polysiloxane diamine is 45 to 200; $R^1$ and $R^2$, the same or different, each represent an alkylene group having 1 to 30 carbon atoms or a phenylene group; and $R^3$ to $R^6$, the same or different, each represent an alkyl group having 1 to 30 carbon atoms, a phenyl group or a phenoxy group.

2. The polyimide resin according to claim 1, having a glass transition temperature of 30° C. or lower.

3. A resin composition comprising the polyimide resin according to claim 2 or a polyamic acid resin which is a precursor of said polyimide resin.

4. A resin composition comprising the polyimide resin according to claim 1 or a polyamic acid resin which is a precursor of said polyimide resin.

5. A cured film obtained by curing the resin composition according to claim 4.

6. A laminated film in which the resin composition according to claim 4 is laminated on at least one side of a heat-resistant insulation film.

7. The laminated film according to claim 6, wherein a release treatment is performed on the surface of said heat-resistant insulation film on which said resin composition is laminated.

8. The laminated film according to claim 6, wherein a release-treated film is further laminated on the surface of said resin composition laminated on said heat-resistant insulation film.

9. A method of producing a semiconductor device comprising:
joining together a substrate for semiconductor circuit formation and a support substrate via at least one adhesive resin layer,
forming the adhesive resin layer with the resin composition according to claim 4,
thinning said substrate for semiconductor circuit formation;
device-processing said substrate for semiconductor circuit formation; and
peeling off said substrate for semiconductor circuit formation from said support substrate.

10. A method of producing a semiconductor device comprising:
joining together a substrate for semiconductor circuit formation and a support substrate via at least one adhesive resin layer,
forming said adhesive resin layer with the laminated film according to claim 6, and
thinning said substrate for semiconductor circuit formation;
device-processing said substrate for semiconductor circuit formation; and
peeling off said substrate for semiconductor circuit formation from said support substrate.

11. The polyimide resin according to claim 1, comprising said residue of said hydroxyl group-containing diamine in an amount of 0.1 to 40% by mole, based on the total amount of said diamine residue.

12. A resin composition comprising the polyimide resin according to claim 11 or a polyamic acid resin which is a precursor of said polyimide resin.

13. A polyimide resin comprising:
an acid anhydride residue;
a diamine residue; and
a methylol compound,
said polyimide resin comprising a residue of a polysiloxane diamine represented by Formula (1) in an amount of not less than 60% by mole in the total amount of said diamine residue:

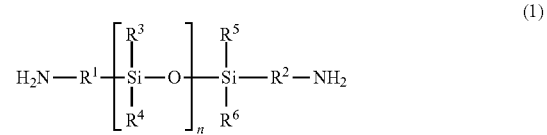

wherein, n is a number of siloxane units and an average value thereof calculated from the average molecular weight of said polysiloxane diamine is 45 to 200; $R^1$ and $R^2$, the same or different, each represent an alkylene group having 1 to 30 carbon atoms or a phenylene group; and $R^3$ to $R^6$, the same or different, each represent an alkyl group having 1 to 30 carbon atoms, a phenyl group or a phenoxy group.

14. The resin composition according to claim 13, wherein said methylol compound is a compound having two or more groups represented by Formula (2):

wherein, when plural $R^7$s exist in said compound, said $R^7$s, the same or different, each represent hydrogen or an alkyl group having 1 to 10 carbon atoms.

15. The resin composition according to claim 13, wherein the content of said methylol compound is 0.1 to 20% by mass with respect to said polyimide resin or said polyamic acid resin which is a precursor of said polyimide resin.

* * * * *